OVERLOAD PROTECTED TRANSISTOR AMPLIFIER

Filed Jan. 22, 1964 2 Sheets-Sheet 1

INVENTOR.
ROBERT M. GRODINSKY
BY
Wallenstein, Spangenberg, Hattis
ATTYS.

INVENTOR.
ROBERT M. GRODINSKY
BY
Wallenstein, Spangenberg & Hattis
ATTYS.

3,363,060
OVERLOAD PROTECTED TRANSISTOR AMPLIFIER

Robert M. Grodinsky, Chicago, Ill., assignor to Sherwood Electronic Laboratories, Inc., Chicago, Ill., a corporation of Illinois Filed Jan. 22, 1964, Ser. No. 339,368
4 Claims. (Cl. 179—1)

ABSTRACT OF THE DISCLOSURE

A transistorized power amplifier is provided with a load circuit that includes a current-limiting resistor having a non-linear characteristic where the resistance is relatively small under normal load and many times this normal value under an abnormally high load. The voltage across the non-linear resistance is employed as a negative feedback signal effective only when the current-limiting resistor has the greatly increased value under abnormally high load conditions. The current-limiting resistor has a response time which is sufficiently slow that the resistance does not follow the fluctuations of the amplified signal and which is sufficiently fast that the current-limiting action thereof takes place before the transistor of the power amplifier stage can be damaged by an abnormally high current flow.

This invention relates to the protection of transistor amplifiers and the like against overload current conditions. It has particular utility in transistorized power amplifiers used in high fidelity sound systems to drive one or more loud speakers, although some aspects of the invention have a broader application.

Heretofore, practically all high fidelity sound amplifier systems sold to the general public have used vacuum tubes in the output or power amplifier stages thereof. Vacuum tubes are inherently self-limiting devices since the current which can be fed through such devices is limited to a great extent by the electron generating limitations of the filaments thereof, and so a short circuit applied across the speaker terminals at the output of a vacuum tube power amplifier stage will not ordinarily harm the vacuum tubes or otherwise damage the circuit.

One of the main reasons why transistors have rarely been utilized in the power amplifier stages of sound amplifying systems is due to the difficulty and expense in protecting the transistors against output short circuit conditions. Unlike vacuum tubes which have spaced electrodes and electron generating filaments, transistors are devices which have directly contacting electrodes which act as very low impedances. Thus, exceedingly large currents can be caused to flow through the transistors under abnormally low or short circuit load conditions which will ordinarily seriously damage the transistors. Abnormally low or short circuit load conditions are not uncommon occurrences in high fidelity sound equipment used in the home where the users thereof are not technically qualified to handle the equipment. In such case, there is a danger that the user will short circuit the speaker terminals or will overload the system with too many loud speakers. Since the high power rated transistors utilized in the power amplifier stages of these amplifiers are relatively expensive, manufacturers desiring to transistorize their amplifier systems must take great precautions to prevent harm to the transistors under abnormally low load conditions. Overload protection techniques heretofore developed have not been very satisfactory in transistorized power amplifier circuits for a number of reasons, among them being the unreliability thereof to widely varying overload circuit conditions, the cost of the components required to achieve such overload protection and the adverse effect of the protective circuit involved on the amplifier characteristics, such as frequency response, damping factor, etc.

The power amplifier stages of most high quality high fidelity sound systems utilize two vacuum tubes or transistors (or groups thereof) biased to operate class B and arranged for "push-pull" operation. In class B, push-pull operation, the input signals fed to the two vacuum tubes or transistors (or the two groups thereof) are 180 degrees out of phase and they will conduct only when the input signal is of one polarity. In such case, the two vacuum tubes or transistors conduct alternately and the average load current thereof is a function both of the amplitude of the signals driving the same and the magnitude of the load connected thereto. Thus, where transistors are used in a power amplifier stage of this type, overheating of the transistors to a point which damages the same can readily occur under short circuit load and low input signal level conditions and modestly low load and high input signal level conditions.

It is, accordingly, one of the objects of the present invention to provide a transistorized power amplifier which includes a few inexpensive components for achieving overload circuit protection. A related object of the invention is to provide a transistorized power amplifier as just described wherein the components which are added to provide the overload protection do not normally materially reduce the power output capabilities of the amplifier system or otherwise substantially adversely affect the other desirable operating characteristics thereof, such as frequency response, damping factor, etc. A still further related object of the present invention is to provide a transistorized amplifier with the overload protection just described which is extremely reliable in operation under widely different load and signal conditions as, for example, when an excessive number of speakers fed thereby are operated in parallel as well as under short circuit load conditions.

One of the techniques heretofore proposed for protecting transistorized sound amplifier systems against overload conditions involves the placement of a current limiting resistor on the amplifier side of the terminals to which the loud speakers are connected, so that an abnormally low load condition due to short circuiting of the loud speaker connecting terminals or an excessive number of loud speakers would not result in excessive current flow due to the presence of the current limiting resistor. However, such a resistor adversely affects the efficiency of the amplifier system. For example, for a speaker impedance of 4 ohms, such a current limiting resistor would normally have an order of magnitude of from 1 to 2 ohms, so that an appreciable amount of power delivered by the amplifier is wasted in the current limiting resistor.

It has also been proposed to utilize fast acting switching devices which respond to abnormally high current or voltage conditions in the load circuit of the amplifier by operating a switch which disconnects the power supply from the amplifier system. This means for overload protection is unsatisfactory, for example, because of the cost of the added equipment necessary to provide the overload protection. Still another method of preventing overheating of the transistor is the placement of thermostat devices on the transistor, which disconnects the power supply from the amplifier system. This method is satisfactorily for modest overload conditions which do not require instantaneous control over the current conditions of the transistors involved, but is unsatisfactory, for example, for instantaneous short circuit or low load conditions which would destroy the transistors involved in a fraction of a second.

One of the features of the present invention is the placement of a special current limiting resistor in series with the load, which resistor has a resistance characteristic which increases in a non-linear manner with the power dissipation thereof, so that at relatively low load current levels the resistance thereof is only a small fraction of the load resistance, so that the resistor will absorb only a small fraction of the power delivered by the amplifier, and at a limiting current level has a rapidly increasing and much larger resistance. For example, the current limiting resistor may have a value of around ¼ of an ohm under normal current levels. If the speaker terminals are short circuited, the resulting increase in current flowing through the current limiting resistor would, for example, desirably increase the resistance thereof to a value of 1 or more ohms and thus limit the current flowing through the transistors accordingly. The non-linear resistance must have a sufficiently fast response time that it can change its resistance from ¼ of an ohm to 1 or more ohms in a sufficiently short interval of time that the transistor will not be damaged during this interval. A response time of the order of from $1/10$ to ¼ of a second would normally be satisfactory for this purpose.

Another aspect of the invention involves the use of the voltage developed across the non-linear current limiting resistor, which is substantial only during an overload condition, in a negative feedback circuit extending to an amplifier stage ahead of the power amplifier referred to. This feedback voltage is connected to the former amplifier stage to reduce the effective drive signal thereon. Since the power amplifier stage is operated class B, the resulting reduction in the input signal thereto reduces the average current flowing through the power amplifier stage transistors. The use of this feedback circuit reduces the value of the current limiting resistor needed to protect the power amplifier. (A lower overload current resistance value of the current limiting resistor usually means a lower normal current resistance value which increases the efficiency of the circuit.)

It is particularly important where this feedback circuit is utilized that the fast acting characteristic of the current limiting resistor be limited to the point that the resistance thereof does not follow the instantaneous change in the amplified signal since this may introduce significant distortion into the amplifier. A response time of from $1/10$ to ¼ of a second is satisfactory since this range of response time is slow relative to the low frequency limit of most high fidelity sound systems.

The load current limiting action of the non-linear current limiting resistor referred to can limit the current levels to a value where the power amplifier transistors withstands such levels for an indefinite period. However, in the most preferred form of the invention, to minimize power loss at normal current levels by further reducing the value of the current limiting resistor needed to protect the power amplifier stage transistors, the value of the current limiting resistor is such as to limit the current under short circuit conditions to a value which would prevent overheating of the transistor for a limited period only, such as 15 seconds more or less. The longer term protection of the transistors is then most advantageously achieved by the use of a thermostat or other thermal-responsive element mounted directly on the housing of the output amplifier transistors, which element responds near the end of this interval by disconnecting the power supply or the input signal from the power amplifier transistors.

Other objects, advantages and features of the invention will become apparent upon making reference to the specification to follow, the claims and the drawings wherein:

Figures 1, 2, 3:
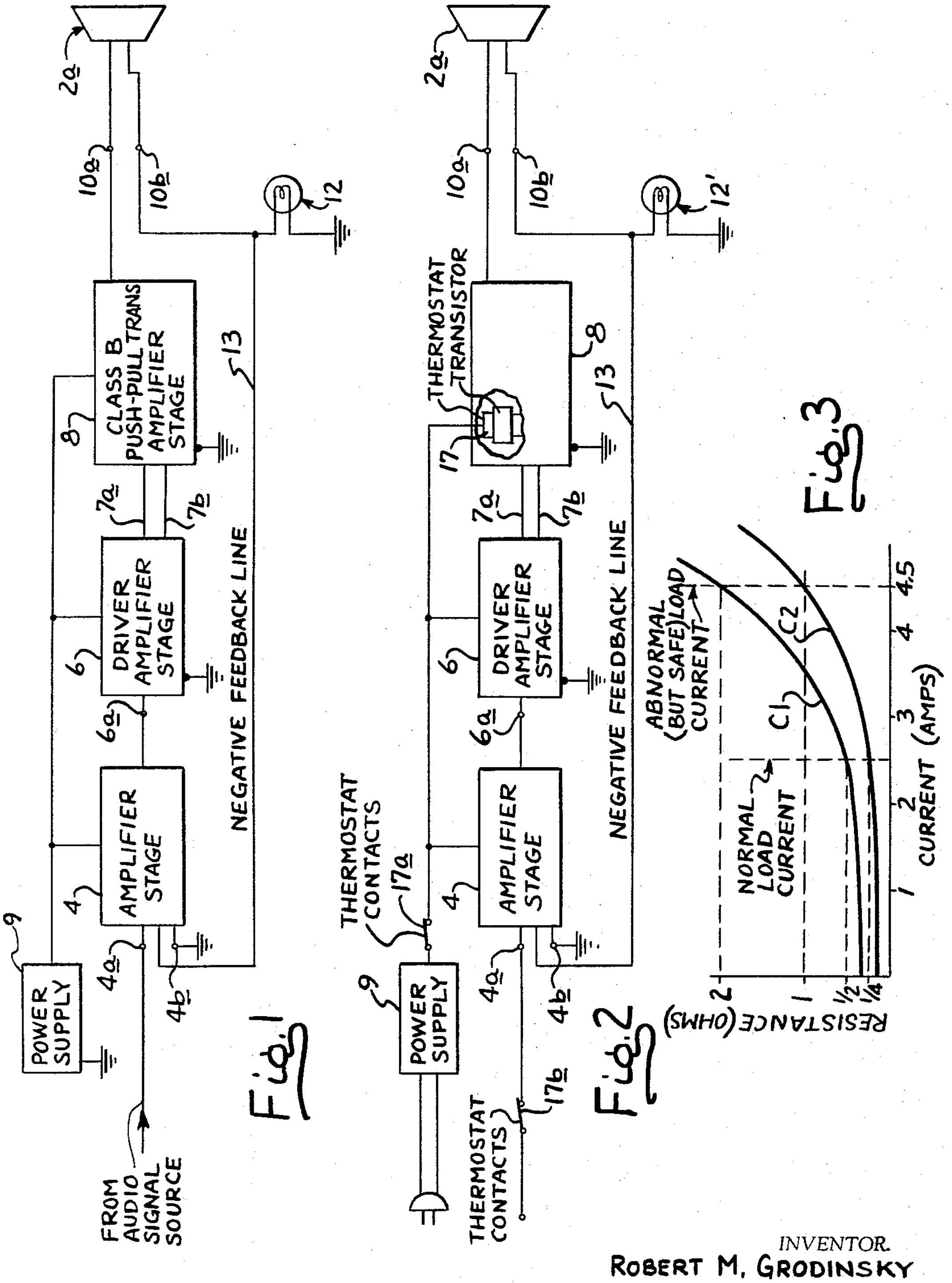
FIG. 1 is a block diagram of an audio amplifier system incorporating one form of the present invention.
FIG. 2 is a box diagram illustrating a modification of the circuit of FIG. 1.
FIG. 3 shows exemplary curves C1 and C2 representing respectively the resistance-current characteristics of the current limiting resistors of the sound amplifying systems of FIGS. 1 and 2.

Refer now to FIG. 1 which illustrates the application of the present invention to an audio amplifier system feeding one or more loud speakers 2a. The audio amplifier system includes a first amplifier stage 4 having a pair of input terminals 4a and 4b across which a suitable audio signal source is connected for amplification. The input terminal 4b is shown as a grounded terminal, ground being a common reference point for all of the amplifier stages to be described. The output of the first amplifier stage 4 is shown connected to the input terminal 6a of a driver amplifier stage 6. The driver amplifier stage 6 has a pair of output lines 7a and 7b respectively connected to two sections of a conventional class B, push-pull, power amplifier stage 8. The signals appearing on the lines 7a and 7b are the waveforms of the amplified signals 180 degrees out of phase. A direct current power supply 9 is connected in the usual manner to the amplifier stages 4, 6 and 8.

As is well known, a power amplifier stage commonly includes at least two current control devices (such as transistors T1 and T2 in FIG. 4) which are fed by identical audio signals which are 180 degrees out of phase. Thus, when one of these signals has a positive magnitude the other will be the mirror image thereof and will have a negative value corresponding to this positive value. Transistors T1 and T2 are normally biased to a cut-off point so that they will conduct only when the voltage fed to the base electrodes thereof are negative (or positive) depending upon the type of transistor used. In such case, the average current drawn by the transistors will be a function of the average amplitude of the signals fed thereto.

The output of the power amplifier stage 8 taken across a pair of output terminals 10a–10b is coupled to the loud speaker 2a connected across the output terminals. The effective load impedance connected across the output terminals is directly proportional to the resistance to the loud speaker 2a. If the output terminals 10a and 10b are inadvertently short circuited, or an excessive number of loud speakers are connected in parallel, the load impedance across the output terminals may drop to such a low value that the transistors will be overloaded and excessive load currents will flow. Since the transistors used in power amplifier stages are expensive components, it is of great importance to protect these transistors from excessive loading.

In accordance with the present invention, this protection is obtained by connecting a special non-linear resistor 12 preferably between the output terminal 10b, which is normally connected to ground, and ground so that the resistance of resistor 12 is effectively in series with the loud speaker connected across the output terminals 10a and 10b with respect to the output of the power amplifier stage 8. In such case, even if the terminals 10a and 10b were short circuited, the resistance of the current limiting resistor 12 will, in a manner to be described, protect the output amplifier stage 8.

Although the concept of connecting a current limiting resistor in series with a load device for protection purpose is not new broadly considered, the present invention utilizes a resistor having special characteristics, namely a non-linear resistor, where the resistance thereof is normally a small fraction of the loud speaker resistance, so that the power delivered by the power amplifier under normal conditions is substantially fully absorbed by the loud speaker 2a. For example, if one loud speaker 2a having a resistance of 8 ohms is connected to output terminals 10a–10b, the resistance of the current limiting resistor 12 at a normal current level of say 2.5 amperes may be about ½ ohm. At abnormally high current levels, say 4.5 amperes, the resistance thereat may be 2 or more ohms which will limit the current flowing in the transistors of the power amplifier stage 8 to a safe value (if the feedback circuit to be described is used in connection therewith). High resistors having non-linear characteristics of the type needed for the present invention are common and well known. For example, the light bulb used in the head lamps of automobiles have the desired non-linear resistance characteristic. Characteristic curves C1 and C2 for two exemplary current limiting resistors are shown in FIG. 3, the resistor having the curve C1 being suitable for the amplifier system shown in FIG. 1 now being described and the resistor having the curve C2 being suitable for the amplifier system of FIG. 2 to be described.

It is desirable that the value of the current limiting resistor 12 be as small as possible, to maximize the efficiency of the circuit. In accordance with another aspect of the invention, the value of the current limiting resistor 12 necessary to effect proper protection of the output amplifier stage 8 can be reduced by utilizing the voltage drop across the resistor 12 as a negative feedback voltage. In the example illustrated in FIG. 1, a feedback line 13 is connected between the ungrounded side of the current limiting resistor 12 and the input circuit of the amplifier stage 4. In a manner to be explained later on in the specification, the voltage on the feedback line 13 opposes the input signal voltage fed to the input terminal 4a of amplifier stage 4. Under normal load conditions for the power amplifier stage 8 where the resistor 12 has a minimum value, this feedback voltage will be insignificant and will thus not materially reduce the effective input signal of the amplifier stage 4. However, for abnormally high load currents (i.e. low load conditions) in the power amplifier stage 8, the resulting high resistance value of the resistor 12 will result in a higher feedback voltage on the line 13, which will materially reduce the net input voltage to the amplifier stage 4. A reduction in the input voltage to the amplifier stage 4 will, in turn, result in a reduction in the input signal to the power amplifier stage 8 which reduces the average load current flow therethrough due to the class B operation thereof.

The speed of response of the resistance changes of resistor 12 to variations in current should be sufficiently fast that the current limiting action will take place before the transistors of the power amplifier stage 8 are damaged. A response time of between ¼ and ⅒ of a second is satisfactory for this purpose. It is important, however, that this speed of response of the resistor 12 to current changes not be so fast that it follows the waveform of the amplified signal since this would introduce distortion components into the amplifier system through the feedback circuit. (Note that for a fixed value of the current limiting resistor 12, the voltage waveform across the resistor will be the desired signal which is being amplified, whereas a rapid variation of the resistance of this resistor will introduce a distortion in this waveform.) The ¼–⅒ of a second response time is fast enough to protect the transistor and slow enough to provide an integrating effect relative to the audible frequency range which constitutes the band width of the amplifying system now being described.

In the example of the invention just described, the action of the current limiting resistor 12 gives permanent protection for the transistors of the output amplifier stage 8. However, to reduce the value of the current limiting resistor 12 necessary to protect this circuit as exemplified by curve C2 in FIG. 3 where the normal resistance at 2.5 amps is ¼ ohm, in accordance with another aspect of the invention shown in FIG. 2, a current limiting resistor 12' and a negative feedback line 13 associated therewith are connected in the same way illustrated in FIG. 1 but the resistor 12' has a lesser value so as to give protection only for a limited period as, for example, 15 to 30 seconds. Thereafter, another protective device which is inherently slow operating comes into play permanently to protect the amplifier system. The device 17 shown in FIG. 2 is a thermostat 17 mounted on the housing of one or more of the transistors of the power amplifier stage 8. The thermostat 17 responds to the temperature conditions of the transistor but, due to the inherently slow operating characteristics thereof, cannot properly protect the power amplifier stage 8 when used without the resistor 12'. The thermostat 17 has a set of contacts 17a connected between the output of the power supply 9 and the various amplifier stages 4, 6 and 8. Thus, when the temperature of the transistor involved approaches an unsafe level, the thermostat 17 will operate to open the contacts 17a and thereby disconnect the supply voltage from the amplifier stages.

Alternatively, the thermostat 17 may be provided with a set of contacts 17b which act to decouple the feeding of the input signal to the amplifier stage 4 which, for reasons previously explained, will reduce the output current of the power amplifier stage 8. The contacts 17b are shown merely to illustrate another possible approach to the controlling of the amplifier system. The disconnection of the power supply from the amplifier stage is a much preferred form of the invention since this is a more positive and safe way of protecting the amplifier system for overload currents flowing beyond the interval protected by the resistor 12'.

As previously indicated, the current limiting resistor 12' in the embodiment of FIG. 2 can have a substantially lower resistance value for both normal and abnormal load conditions than the form of the invention of FIG. 1 where the current limiting resistor 12 and the associated feedback circuit give long term protection for the amplifier system.

Figure 4:
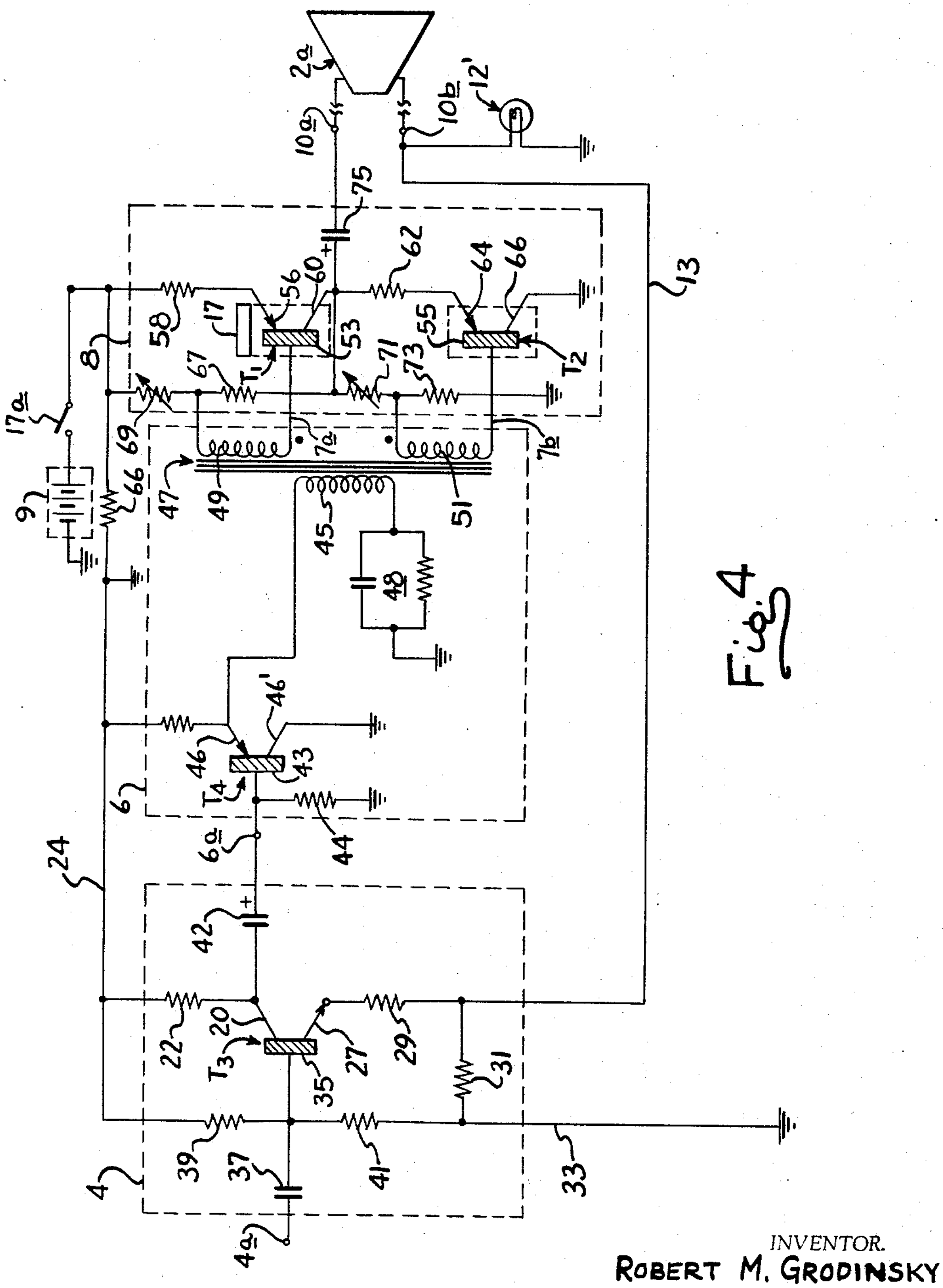
FIG. 4 is a circuit diagram of the circuit illustrated in in FIG. 2.

FIG. 4 illustrates a schematic diagram of an exemplary amplifier system using transistors to which the present invention is applied, and is an example of the form of the invention shown in FIG. 2 with the thermostat contacts 17b omitted. As there shown, the amplifier stage 4 includes an NPN transistor T3 whose collector electrode 20 is connected through a resistor 22 to a positive voltage line 24 coupled through a dropping resistor 26 and the thermostat contacts 17a to the positive terminal of the DC power supply 9. (The negative terminal of the DC power supply is grounded.) The collector electrode 27 of the transistor T3 is connected through series conected resistors 29 and 31 to a grounded line 33. The base electrode 35 of the transistor T3 is connected to an input coupling capacitor 37 and also to the juncture of a pair of resistors 39 and 41 respectively connected to the positive line 24 and the ground line 33.

The output of the amplifier stage 4 taken at the collector electrode 20 is coupled through a coupling capacitor 42 to the input 6a of the driver amplifier stage 6 connected to the base electrode 43 of a PNP transistor T4. A resistor 44 is connected between the emitter electrode 46 of the transistor T4 and the positive line 24 and the collector electrode 46' of the transistor T4 is grounded. The primary winding 45 of a transformer 47 is connected between the emitter electrode 46 of the transistor T4 and one end of a parallel capacitor-resistor network 48 whose other end is grounded. The transformer 47 has a pair of secondary windings 49 and 51 which are respectively connected to output lines 7a and 7b at which two identical amplified signals appear 180 degrees apart in phase. The output lines 7a and 7b are respectively connected to the base electrodes 53 and 55 of the previously mentioned PNP transistors T1 and T2. The transistor T1 has an emitter electrode 56 coupled through a resistor 58 to the juncture between the dropping resistor 26 and the thermostat contacts 17a. The collector electrode 60 of the transistor T1 is connected through a resistor 62 to the emitter collector 64 of the transistor T2. The collector electrode 66 of the transistor T2 is grounded. The side of the resistor 62 remote from the transistor T2 is also connected through resistors 67 and 69 to the juncture of the dropping resistor 26 and the thermostat contacts 17a. Resistors 71 and 73 are connected in series between the collector electrode 56 of transistor T1 and ground. The ends of the secondary windings 49 and 51 of the transformer 47 opposite the ends connected to the output lines 7a and 7b are connected respectively to the juncture of the resistor pairs 69–67 and 71–73. The connections of the secondary windings are such that the transistors T1 and T2 are operated in push-pull which, as above indicated, render the transistors T1 and T2 alternately conductive.

When the transistor T1 is conductive, the AC load current flows through a circuit including the resistor 58, the emitter and collector electrodes of the transistor T1, and the speaker circuit. As previously indicated, the transistor T1 will be conductive at a time when the transistor T2 is non-conductive and vice versa. When transistor T2 is rendered conductive, the AC load current flows through the speaker circuit, the resistor 62 and the emitter and collector electrodes of the transistor T2. The resistors 69 and 71, on the one hand, and the resistors 67 and 73, on the other hand, are of identical values and of much larger value than the speaker circuit in which only AC current flows. The resistor pairs 67–69 and 71–73 are operative primarily to carry DC current around the non-conducting transistor.

The output of the power amplifier stage 8 is taken at the collector electrode 56 of the transistor T1, and an output coupling capacitor 75 is connected between this point and the output terminal 10a remote from the output terminal 10b connected to the current limiting resistor 12'. As before, the current limiting resistor 12' is connected between the load terminal 10b and ground.

The voltage appearing across the current limiting resistor 12' is coupled by the feedback line 13 to the juncture of resistors 29 and 31 of the amplifier stage 4. The phase of the voltage fed back on the line 13 is such that it produces a voltage across the emitter circuit resistor 31 which acts in opposition to the signal voltage fed to the base base electrode 35 of the transistor T3 from the input terminal 4a. Under normal load conditions, this feedback voltage is so small that it does not substantially affect the output of the amplifier stage 4. However, under abnormal load conditions, when the resistance of the current limiting resistor 12' is appreciable, this voltage will materially reduce the amplitude of the output signal of the amplifier stage 4, which, in turn, further reduces the current flow in the power amplifier stage 8 for reasons previously explained.

It is apparent that the various aspects of the present invention provide an exceedingly simple and inexpensive circuit for preventing damage to the power transistors T1 and T2 of the power amplifier stage 8 under varying load and signal conditions. The provision of the negative feedback line 13 and the thermostat 17 enables the resistance of the current limiting resistor 12' to be reduced to a minimum value so that the efficiency of the amplifier system is not significantly effected during normal operation of the system.

It should be understood that numerous modifications may be made in the most preferred forms of the invention described above without deviating from the broader aspects of the invention.

What I claim as new and desire to protect by Letters Patent of the United States is:

1. In an audio amplifier system having a transistorized power amplifier stage with a pair of transistors operated class B and wherein the average load current flow in the transistors increases with an increase in the average input signal amplitude and a decrease in the load resistance connected to the output thereof, at least one amplifier stage coupled to the input of said power amplifier stage and loud speaker means connected to the output of said power amplifier stage, the improvement in protective means for preventing damage to transistors of the power amplifier stage due to an abnormally low load resistance connected to the output thereof, said improvement comprising a current limiting resistor coupled in series with said loud speaker means to limit the magnitude of the load current flow through said power amplifier stage, said current limiting resistor having a non-linear current resistance characteristic where the resistance thereof is small relative to the resistance of said loud speaker means for the current flowing through the resistor when the load resistance of the power amplifier stage is of a normal value and is many times this normal value to limit current flow at a much higher current level resulting from an abnormally low load resistance, and a negative feedback line extending between said current limiting resistor and the input to said one amplifier for coupling to said input an appreciable voltage from said current limiting resistor which opposes the signal input to said one amplifier stage only when the resistance of said current limiting resistor has said larger value, said current limiting resistor having a response time which is sufficiently slow that it cannot follow the changes in the audio signal to be amplified and is sufficiently fast that the current limiting action thereof takes place before any transistor of the power amplifier stage can be damaged by abnormally high current flow therethrough.

2. In an audio amplifier system having a transistorized power amplifier stage with a pair of transistors operated class B and wherein the average load current flow in the transistors increases with an increase in the average input signal amplitude and a decrease in the load resistance connected to the output thereof, at least one amplifier stage coupled to the input of said power amplifier stage and loud speaker means connected to the output of said power amplifier stage, the improvement in protective means for preventing damage to transistors of the power amplifier stage due to an abnormally low-load resistance connected to the output thereof, said improvement comprising a current limiting resistor coupled in series with said loud speaker means to limit the magnitude of the load current flow through said power amplifier stage, said current limiting resistor having a non-linear current resistance characteristic where the resistance thereof is small relative to the resistance of said loud speaker means for the current flowing through the resistor when the load resistance of the power amplifier stage is of a normal value and is many times this normal value to limit current flow at a much higher current level resulting from an abnormally low load resistance, a negative feedback line extending between said current limiting resistor and the input to said one amplifier for coupling an appreciable voltage from said current limiting resistor which opposes the signal input to said one amplifier stage only when the resistance of said current limiting resistor has said larger value, said current limiting resistor having a response time which is sufficiently slow that it cannot follow the changes in the audio signal to be amplified and which is sufficiently fast that the current limiting action thereof takes place before any transistor of the power amplifier stage can be damaged by abnormally high current flow therethrough for a first given interval, and a thermally-responsive device for protecting the transistors of the power amplifier stage against damage beyond said given interval, said thermally-responsive device being mounted contiguous to a transistor of said power amplifier stage and including contacts for reducing the input signal to said power amplifier stage substantially to zero when the temperature of said transistor exceeds a dangerous level.

3. In an amplifier system having a transistorized power amplifier stage with a pair of transistors operated class B and wherein the average load current flow in the transistors increases with an increase in the average input signal amplitude and a decrease in the load resistance connected to the output thereof, at least one amplifier stage having an output coupled to the input of said power amplifier stage, said power amplifier stage and said one amplifier stage having signal input and output circuits respectively extending between distinctively different points associated therewith and a reference point common to all of the same and a pair of output terminals one of which is coupled to the output of said power amplifier stage and across which the load to be fed by the power amplifier stage is to be connected, the improvement in protective means for preventing damage to the transistors of the power amplifier stage due to an abnormally low resistance connected across said output terminals, said improvement comprising a current limiting resistor coupled between the other of said output terminals and said common reference point to limit the magnitude of the current flow through said power amplifier stage for an abnormally low load resistance across said terminals, said current limiting resistor having a non-linear current resistance characteristic where the resistance thereof is small relative to the resistance of a normal load to be connected across said output terminals for the current flowing through the resistor when the load resistance is normal and is many times this normal value to limit current flow at a much higher current level resulting from an abnormally low resistance across said terminals, and a negative feedback line extending between the end of said current limiting resistor remote from said common reference point and the input circuit to said one amplifier, for coupling an appreciable voltage from said current limiting resistor which opposes the signal input to said one amplifier stage only when the current limiting resistor has said greatly increased value under abnormally low load resistance conditions, said current limiting resistor having a response time which is sufficiently slow that the resistance thereof does not follow the fluctuations of the amplified signal and which is sufficiently fast that the current limiting action thereof takes place before the transistors of the power amplifier stage can be damaged by current flow therethrough.

4. In an amplifier system having a transistorized power amplifier stage with a pair of transistors operated class B and wherein the average load current flow in the transistors increases with an increase in the average input signal amplitude and a decrease in the load resistance connected to the output thereof, at least one amplifier stage coupled to the input of said power amplifier stage, said power amplifier stage and said one amplifier stage having signal input and output circuits respectively extending between distinctively different points associated therewith and a reference point common to all of the same and a pair of output terminals one of which is coupled to the output of said power amplifier stage and across which the load to be fed by the power amplifier stage is to be connected, the improvement in protective means for preventing damage to the transistors of the power amplifier stage due to an abnormally low resistance connected across said output terminals, said improvement comprising a current limiting resistor coupled between the other of said output terminals and said common reference point to limit the magnitude of the current flow through said power amplifier stage for an abnormally low load resistance across said terminals, said current limiting resistor having a non-linear current resistance characteristic where the resistance thereof is small relative to the resistance of a normal load to be connected across said output terminals for the current flowing through the resistor when the load resistance is normal and is many times this normal value to limit current flow at a much higher current level resulting from an abnormally low resistance across said terminals, and a negative feedback line extending between the end of said current limiting resistor remote from said common reference point and the input circuit to said one amplifier, for coupling an appreciable voltage from said current limiting resistor which opposes the signal input to said one amplifier stage only when the current limiting resistor has said greatly increased value under abnormally low load resistance conditions, said current limiting resistor having a response time which is sufficiently slow that the resistance thereof does not follow the fluctuations of the amplified signal and which is sufficiently fast that the current limiting action thereof takes place before any transistor of the power amplifier stage can be damaged by abnormally high current flow therethrough for a first given interval, and a thermally-responsive device for protecting the transistors of the power amplifier stage against damage beyond said given interval, said thermally-responsive device being mounted contiguous to a transistor of said power amplifier stage and including contacts for reducing the input signal to said power amplifier stage substantially to zero when the temperature of said transistor exceeds a dangerous level.

References Cited

UNITED STATES PATENTS

| | | | |
|---|---|---|---|
| 2,237,448 | 4/1941 | Reinhard | 179—1 |
| 3,073,899 | 1/1963 | Farnsworth | 179—1 |
| 2,566,057 | 8/1951 | Devine | 179—1 |

KATHLEEN H. CLAFFY, *Primary Examiner.*

R. P. TAYLOR, *Assistant Examiner.*